United States Patent Office 3,388,995
Patented June 18, 1968

3,388,995

PHOTOPOLYMER OFFSET PRINTING PLATES

Andre K. Schwerin, deceased, late of Binghamton, N.Y., by Johanna Schwerin, administratrix, Binghamton, N.Y., and Carl E. Diener, Binghamton, and Steven Levinos, Vestal, N.Y., assignors to General Aniline & Film Corporation, New York, N.Y., a corporation of Delaware No Drawing. Filed Aug. 10, 1964, Ser. No. 391,826
5 Claims. (Cl. 96—86)

ABSTRACT OF THE DISCLOSURE

A negative working, metal offset photopolymer plate having a hydroxyethyl cellulose coated metal base and, thereon, a lipophilic resin matrix consisting of a vinyl or acrylic polymer or copolymer having dispersed therein a water-soluble, ethylenically unsaturated monomer containing a $CH_2{=}C<$ group and a radiation-sensitive catalyst.

The present invention relates to pre-sensitized negative working metal offset printing plates having a matrix of a stabilized lipophilic vinyl polymer latex containing a water-soluble ethylenically unsaturated monomer and a photoinitiator which upon irradiation induces polymerization of the monomer.

Photopolymerization systems have been proposed in which a gelatin matrix contains a monomer and as a photoinitiator a ferric ($Fe^{+3}$) or ceric ($Ce^{+4}$) salt which induces image-wise polymerization of the monomer in the presence of a per compound or reducing agent.

It is understood that in these systems the chain initiating process leading to polymerization of the monomer is due to a redox initiated, free radical generation with subsequent addition polymerization.

Moreover, in these systems the monomer is soluble in gelatin solutions or solutions of hydrophilic gelatin substitutes. Consequently, the polymer resist obtained by exposure and washout of the unpolymerized areas is still water-sensitive, although its water solubility is greatly reduced.

In order to obtain increased oil receptivity of such a resist it has been suggested that there be dispersed in the gelatin matrix a water-insoluble vinyl or acrylic resin. To this end, resort is had to such polymers as phenol modified cumarone-indene resins, polyvinyl actate, polymethacrylate, polymethylacrylate, polyethylacrylate; cellulose ethers such as ethyl cellulose; cellulose esters such as cellulose acetate, cellulose propionate, cellulose acetate-butyrate, and the like.

To obtain a photopolymerizable coating, these lipophilic resins are dispersed into an aqueous solution containing gelatin, a water-soluble ethylenically unsaturated monomer containing a $CH_2{=}C<$ group and a photoinitiator such as those referred to above.

It is believed that, under the influence of radiation to which the coating is subjected, a water-insoluble three-dimensional polymer network is formed with the lipophilic resin trapped between the chains of the network.

Such systems, unfortunately, have several disadvantages, one being their relative instability. Precipitation of the dispersed resin from the aqueous gelatin phase often occurs during the coating of the emulsion on a metal surface such as aluminum. Furthermore, the adhesion of the coating to the surface of the metal plate, either pretreated or untreated, is most unsatisfactory. Thus, in many cases the exposed areas of the coating adhere insufficiently to the metal surface and are removed during development. In other cases, it is difficult to remove the unexposed areas during the washout operation.

It has now been discovered that these disadvantages can be overcome and pre-sensitized coatings of good stability and adhesion to metal plates may be obtained by using as the matrix a stabilized emulsion of lipophilic vinyl or acrylic polymers or copolymers and by anchoring such a matrix to the surface of the metal base by means of hydroxyethyl cellulose.

The preparation of negative working offset printing plates utilizing these features constitutes the purpose and objective of the present invention.

The base plate used is preferably aluminum although zinc plates may be employed in some instances. Such plates, either pretreated or untreated, are subbed with a coating designed to tenaciously anchor the resin matrix containing the monomer and photoinitiator to the surface of the metal, but to relax adhesion of the unexposed areas during processing so that they may be removed during the washout step.

Preferably, the anchoring layer which is employed is hydroxyethyl cellulose sold by the Hercules Powder Company as Natrosol–250L. usually this resin is applied in the form of a 0.5 to 1% aqueous solution. It has been found that the water solubility of this resin allows easier washing away of the unexposed areas of the matrix. On the other hand, the thin nature of this coating does not interfere with the adhesion of the image areas to the base. Natrasol–250L is a non-ionic water-soluble hydroxyethyl cellulose.

The matrix coated on the sub-coated metal base is a stabilized emulsion of a lipophilic vinyl polymer, such as polymethylacrylate, polyethylacrylate, polyvinyl acetate; copolymers of vinyl acetate and ethylacrylate; terpolymers or ethylacrylate, butylacrylate and vinyl acetate, of ethylacrylate, styrene and methacrylic acid, of vinyl acetate, octyl fumarate and maleic acid, of vinyl acetate, butyl maleate and acrylic acid, and the like.

Techniques for the stabilization of these polymer and copolymer emulsions are well known; and in this connection, reference is made to the formulations published by the Celanese Corporation in "Vinyl Acetate Monomers in Emulsion Technology," pages 19 to 25, and "Acrylates," pages 27 to 32. Further, such stabilized emulsions are sold on the open market by the Celanese Corporation, National Starch and Chemical Corporation, etc.

Particularly, valuable emulsions for our purpose are the vinyl acetate:acrylic co-polymers and terpolymers sold by National Starch and Chemical Corporation as Resyns 78–3113, 25–2203, 16–4601, 25–2200, 25–1411 and 25–1234. The average solid content of these emulsions is about 45 to 50%, average grain size about .1 micron and average viscosity about 650 cps.

The resins are emulsified in a starch or dextrose solution. If desired, other water-soluble colloids preventing agglomeration of the polymer particles may be used, such as polyvinyl alcohol, methyl cellulose, sodium polyacrylate, and the like. Preferably, the pH of the emulsion should not exceed 6.0.

We have also ascertained that mixtures of different vinyl co-polymers within the above category, one of which has affinity for the metal of the base plate, i.e., aluminum, yield exceptionally good matrices. Typically a mixture of Resyns 25–2200 and 25–1411, the latter having a strong affinity for aluminum, when used in a ratio of 4 to 1 by weight gave a superior plate.

The water-soluble monomer containing a $CH_2{=}C<$ group and the photoinitiator are dispersed in the resin emulsion while resorting to the use of surfactants such as lauryl sulfate, oleyl-N-methyl taurine sodium salt, saponin, or the like if desired. Examples of suitable monomers are acrylamide, methacrylamide, N-ethanolacrylamide, acrylic acid, methacrylic acid, calcium acrylate, vinyl acetate, N,N'-methylenebisacrylamide, divinylbenzene, and the like. Preferably, use is made of those monomers having a cross-linking function, as sharper resists are produced therewith.

Any radiation sensitive catalyst or photoinitiator may be employed. Suitable for the contemplated purpose are silver compounds, such as silver nitrate, silver chloride, etc.; silver halide emulsions, such as silver bromide developing-out emulsions; amphoteric metal oxides, such as zinc oxide or titanium dioxide; ceric salts with reducing agents as in application Ser. No. 229,502, filed Oct. 9, 1962; and particularly, the ferric salt system of U.S. Patent 3,101,270, dated Aug. 20, 1963. Best results ensue when the matrix contains a radiation sensitive ferric salt and the resist is developed by treatment in a dilute solution of a per compound such as hydrogen peroxide. However, it is also feasible to add the per compound, if solid or liquid, to the matrix and to develop with water.

The speed of the photopolymerization system may be increased by the addition of dextrose. This is particularly true where the catalyst employed is a ferric salt.

The plate is made up by dispersing the resin of the subcoat in water by means of a surfactant, coating the dispersion on the base plate, and drying.

The resin emulsion forming the matrix is dispersed in water with the catalyst, monomer, dextrose and surfactant, coated over the sub-coat and dried.

Processing of the plate may then take place as described in the examples.

The invention is illustrated in the following examples, but it is to be understood, that it is not limited thereto.

Example I

A surface-treated non-presensitized aluminum sheet, such as available from Sumner-Williams Incorporated, was coated with a composition consisting of 50 cc. of hydroxyethyl cellulose, sold as "Natrosol-250L" and described above as a 0.5% aqueous solution, plus 2 cc. of an 8% solution of maleic anhydride, plus 1 cc. of saponin, 8%. After this sub-coating was applied and allowed to dry, an overcoating was applied having the following formula:

| | | |
|---|---|---|
| Resyn 25-2200 (vinyl acrylic co-polymer) | g. | 20 |
| Resyn 25-1411 (vinyl acetate co-polymer) | g. | 5 |
| N,N'-methylenebisacrylamide | g. | 2 |
| Dextrose | g. | 2 |
| Water | cc. | 60 |
| Saponin 8% | cc. | 2 |
| Ferric ammonium citrate 36%, brown | cc. | 5 |

After drying in subdued yellow light, the plate was exposed through a photographic half-tone negative to a 15 watt BL light at a distance of 2½ inches for an exposure time of 3 minutes. Exposure, of course, may be made through a line negative with identical results.

After exposure the plate was dipped into a 1% aqueous hydrogen peroxide solution. The unexposed parts were thereafter washed from the plate with a soft cellulose sponge. Subsequently, the plate was rinsed with warm water (40° C.) and dried. The image was further developed and densified with a suitable printing plate image developer. If desired, a lacquer may be used to overcoat the image, although this was not done in this particular example.

The plate so developed was found to have image areas which were very satisfactory in lipophilic qualities. The plate was very suitable for normal offset press printing procedures, and it gave long life in use.

Example II

The procedure was the same as in Example I, except that the ferric salt was replaced by 30 cc. of ceric ammonium nitrate (0.01 N) and 7 cc. of oxalic acid and the peroxide was dispensed with.

The results were similar to those of Example I.

It will be understood that various modifications, in addition to those suggested above, may be made by those skilled in the art without departing from the principle of this invention. It is intended by the claims which follow to cover such variations, etc., so far as the prior art properly permits.

What is claimed is:

1. A negative working, metal offset photopolymer plate comprising a metal base, a matrix of a lipophilic resin selected from the class consisting of an acrylate polymer, a vinyl acetate polymer and co-polymers of both, coated from a stabilized emulsion of said resin, said matrix having dispersed therein a water-soluble ethylenically unsaturated monomer containing a $CH_2{=}C<$ group and a radiation sensitive catalyst.

2. The article as defined in claim 1 wherein there is interpolated between the base plate and matrix a sub-coat of hydroxyethyl cellulose.

3. A negative working metal offset photopolymer plate comprising an aluminum base having a surface thereof coated with a thin layer of hydroxyethyl cellulose, a lipophilic vinyl acetate acrylic co-polymer matrix coated on said thin layer from a stabilized emulsion, said matrix having dispersed therein a water-soluble ethylenically unsaturated monomer having a $CH_2{=}C<$ group and a radiation sensitive ferric salt.

4. The article as defined in claim 3 wherein the matrix contains dextrose as a speed increasing agent.

5. The article as defined in claim 4 wherein the monomer is N,N'-methylenebisacrylamide and the ferric salt is ferric ammonium citrate.

References Cited

UNITED STATES PATENTS

| | | | |
|---|---|---|---|
| 3,016,823 | 1/1962 | Thurlow | 96—33 X |
| 3,072,482 | 1/1963 | Beeber et al. | 96—75 |
| 3,097,096 | 7/1963 | Oster | 96—86 X |
| 3,101,270 | 8/1963 | Evans et al. | 96—115 |
| 3,169,065 | 2/1965 | Sorkin | 96—33 |

FOREIGN PATENTS

| | | |
|---|---|---|
| 793,550 | 4/1958 | Great Britain. |

NORMAN G. TORCHIN, *Primary Examiner.*

R. H. SMITH, *Assistant Examiner.*